United States Patent
Morton et al.

(10) Patent No.: US 10,707,547 B2
(45) Date of Patent: *Jul. 7, 2020

(54) BIPLANAR TAPERED LINE FREQUENCY SELECTIVE LIMITER

(71) Applicant: Raytheon Company, Waltham, MA (US)

(72) Inventors: Matthew A. Morton, Reading, MA (US); Gerhard Sollner, Winchester, MA (US); Jason C. Soric, Bedford, MA (US)

(73) Assignee: Raytheon Company, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/018,768

(22) Filed: Jun. 26, 2018

(65) Prior Publication Data

US 2019/0393578 A1    Dec. 26, 2019

(51) Int. Cl.
*H01P 1/23* (2006.01)
*H01P 1/215* (2006.01)
(Continued)

(52) U.S. Cl.
CPC .............. *H01P 1/23* (2013.01); *H01P 1/215* (2013.01); *H01P 1/218* (2013.01); *H01P 1/227* (2013.01);
(Continued)

(58) Field of Classification Search
CPC .. H01P 1/215; H01P 1/218; H01P 1/23; H01P 1/227; H01P 3/003; H01P 3/006; H03H 7/38; H03G 11/006; H03G 11/00
(Continued)

(56) References Cited

U.S. PATENT DOCUMENTS 4,283,692 A   8/1981  Adam
4,605,911 A   8/1986  Jin
(Continued)

FOREIGN PATENT DOCUMENTS

CN   CN206639899    11/2017
JP   2001036155 A   2/2001
WO   WO 97/44850    11/1997

OTHER PUBLICATIONS

Adam et al., "Frequency Selective Limiters for High Dynamic Range Microwave Receivers;" IEEE Transactions on Microwave Theory and Techniques, vol. 41, No. 12; Dec. 1993; 5 Pages.
(Continued)

*Primary Examiner* — Stephen E. Jones
(74) *Attorney, Agent, or Firm* — Daly, Crowley, Mofford & Durkee LLP (57) ABSTRACT

A frequency selective limiter (FSL) is provided having a transmission line structure with a tapered width. The FSL includes a magnetic material having first and second opposing surfaces. A first conductor is disposed on the first surface of the magnetic material, where a width of the first conductor decreases from a first end of the FSL to a second end of the FSL along a length of the FSL. Two second conductors are disposed on the second surface of the magnetic material, where a width of a gap between the two second conductors decreases from the first end of the FSL to the second end of the FSL along a length of the FSL. The first conductor and two second conductors form a biplanar waveguide transmission line.

29 Claims, 7 Drawing Sheets

(51) Int. Cl.

| | |
|---|---|
| *H01P 1/218* | (2006.01) |
| *H01P 1/22* | (2006.01) |
| *H01P 3/08* | (2006.01) |
| *H01P 11/00* | (2006.01) |
| *H03G 11/00* | (2006.01) |
| *H03G 11/06* | (2006.01) |

(52) U.S. Cl.
CPC .............. *H01P 3/08* (2013.01); *H01P 11/003* (2013.01); *H03G 11/00* (2013.01); *H03G 11/06* (2013.01)

(58) Field of Classification Search
USPC .......................................... 333/17.2, 33, 34
See application file for complete search history.

(56) References Cited

U.S. PATENT DOCUMENTS

| | | | |
|---|---|---|---|
| 4,845,439 | A | 7/1989 | Stitzer et al. |
| 4,980,657 | A | 12/1990 | Stitzer et al. |
| 5,023,573 | A | 6/1991 | Adam |
| 5,847,628 | A | 12/1998 | Uchikoba et al. |
| 6,593,833 | B2 | 7/2003 | Joines et al. |
| 6,998,929 | B1 | 2/2006 | Adam |
| 7,656,167 | B1 | 2/2010 | McLean |
| 8,933,763 | B2 | 1/2015 | Fast |
| 9,300,028 | B2 | 3/2016 | Morton et al. |
| 9,711,839 | B2 | 7/2017 | Morton et al. |
| 2003/0214364 | A1 | 11/2003 | Cites et al. |
| 2004/0012458 | A1 | 1/2004 | Amparan et al. |
| 2005/0093737 | A1 | 5/2005 | Schoebel |
| 2007/0236400 | A1 | 10/2007 | Rentz |
| 2009/0027144 | A1 | 1/2009 | Saito |
| 2011/0043299 | A1 | 2/2011 | Ding et al. |

OTHER PUBLICATIONS

Stitzer et al., "A Multi-Octave Frequency Selective Limiter;" IEEE International Microwave Symposium (MTT-S Digest); Jun. 1983; 3 Pages.
Stitzer et al., "X-band YIG Limiters for FM/CW Radar;" Microwave Journal, vol. 20, No. 57; Dec. 1977; pp. 35-38; 1 Page (Abstract Only).
Suhl, "The Nonlinear Behavior of Ferrites at High Microwave Signal Levels;" Proceedings of the IRE, vol. 44, Issue 10; Oct. 1956; pp. 1270-1284; 15 Pages.
U.S. Appl. No. 15/627,913, filed Jun. 20, 2017, Morton et al.
Thomann; "Characterization and Simulation of Bi-Quadratic Coplanar Waveguide Tapers for Time-Domain Applications"; Microwave Symposium Digest, 1993, IEEE MTT-S International; Jun. 14, 1993; 30 Pages.
PCT Written Opinion of the International Searching Authority dated Nov. 27, 2018, for Application No. PCT/US2018/034369; 11 Pages.
PCT International Search Report dated Nov. 27, 2018, for Application No. PCT/US2018/034369; 6 Pages.
Chua et al., "Microfabricated Planar Helical Slow-Wave Structures Based on Straight-Edge Connections for THz Vacuum Electron Devices;" Invited Paper; Terahertz Science and Technology, ISSN 1941-7411, vol. 4, No. 4; Dec. 2011; pp. 208-229; 22 Pages.
Seki et al., "Cross-Tie Slow-Wave Coplanar Waveguide on Semi-Insulating GaAs Substrates;" Electronics Letters, vol. 17, No. 25; Dec. 10, 1981; pp. 940-941; 2 Pages.
U.S. Non-Final Office Action dated Jul. 22, 2015 for U.S. Appl. No. 14/077,909; 10 Pages.
Response to U.S. Non-Final Office Action dated Jul. 22, 2015 for U.S. Appl. No. 14/077,909; Response filed Oct. 8, 2015; 11 Pages.
Second Response to U.S. Non-Final Office Action dated Jul. 22, 2015 for U.S. Appl. No. 14/077,909; Response filed Oct. 14, 2015; 11 Pages.
U.S. Notice of Allowance dated Dec. 8, 2015 for U.S. Appl. No. 14/077,909; 10 Pages.
International Search Report dated Jul. 12, 2019 for International Application No. PCT/US2019/031661; 6 Pages.
Johnson; "Tapered Transitions"; EDN Magazine; Oct. 11, 2001; 3 Pages.
Maleszka, et al.; "Broadband Stripline to Microstrip Transition with Constant Impedance Field Matching Section for Applications in Multilayer Planar Technologies"; Radar and Wireless Communications; 18th International Conference on Microwaves; Jun. 14-16, 2010; 4 Pages.
Written Opinion of the ISA dated Jul. 12, 2019 for International Application No. PCT/US2019/031661; 13 Pages.
U.S. Non-Final Office Action dated Feb. 28, 2019 for U.S. Appl. No. 15/627,913; 13 Pages.
Communication Pursuant to Rules 161(1) and 162 EPC dated Aug. 22, 2018 for European Application No. 17701955.1; 3 Pages.
International Preliminary Report on Patentability dated Jul. 26, 2018 for International Application No. PCT/US2017/012937; 11 Pages.
Interview Summary dated May 17, 2019 for U.S. Appl. No. 15/627,913; 3 Pages.
Notice of Allowance dated Apr. 10, 2017 for U.S. Appl. No. 14/996,881; 9 pages.
Notice of Allowance dated Aug. 1, 2019 for Australian Application No. 2017206716; 7 Pages.
Office Action dated Jul. 5, 2016 for U.S. Appl. No. 14/996,881; 10 pages.
Office Action dated Dec. 2, 2016 for U.S. Appl. No. 14/996,881; 7 pages.
Office Action dated Mar. 22, 2019 for Chinese Application No. 201780006651.3 with English Translation; 34 Pages.
Office Action dated Jun. 4, 2019 for Japanese Application No. 2018-536256 with English Translation; 8 Pages.
PCT Search Report and Written Opinion of the ISA dated Mar. 31, 2017 for International Application No. PCT/US2017/012937; 18 Pages.
U.S. Appl. No. 16/530,056, filed Aug. 2, 2019, Morton, et al.
Response to Communication Pursuant to Rules 161(1) and 162 EPC dated Aug. 22, 2018 for European Application No. 17701955.1 as filed on Feb. 22, 2019; 18 Pages.
Response to Office Action dated Mar. 22, 2019 for Chinese Application 201780006651.3 as filed on Aug. 6, 2019 with English Translation; 12 Pages.
Response to Office Action dated Jul. 5, 2016 for U.S. Appl. No. 14/996,881, filed Aug. 25, 2016; 10 Pages.
Response to Office Action dated Dec. 2, 2016 for U.S. Appl. No. 14/996,881, filed Feb. 16, 2017; 10 Pages.
Response to Restriction Requirement dated Oct. 29, 2018 for U.S. Appl. No. 15/627,913; 1 Page.
Restriction Requirement dated Oct. 29, 2018 for U.S. Appl. No. 15/627,913; 6 Pages.
Tsutsumi, et al.; "Magnetostatic-Wave Envelope Soliton in Microstrip Line Using YIG-Film Substrate"; IEEE Transactions on Microwave Theory and Techniques; vol. 48; No. 2; Feb. 1, 2000; 6 Pages.
Voluntary Amendment filed on Jul. 19, 2019 for Australian Application No. 2017206716; 13 Pages.
Warit, et al.; "Microwave Circulator Using Yttrium Iron Garnet Film"; Microwave Conference, 2000 Asia-Pacific; Dec. 3-6, 2000; 2 Pages.
Response filed on Sep. 4, 2019 for Taiwan Application No. 107118892 with English Translation; 15 Pages.
Notice of Allowance dated Jul. 3, 2019 for U.S. Appl. No. 15/627,913; 6 Pages.
Office Action dated Jun. 4, 2019 for Taiwan Application No. 107118892 with English Translation; 20 Pages.
Response to Non-Final Office Action dated Feb. 28, 2019 for U.S. Appl. No. 15/627,913, filed May 23, 2019; 20 Pages.
Decision of Rejection (with English Translation) dated Nov. 12, 2019 for Taiwanese Application No. 107118892; 5 Pages.
European Intention to Grant/Communication Pursuant to Rule 71(3) EPC dated Nov. 11, 2019 for European Application No. 17701955.1; 5 Pages.

(56) References Cited

OTHER PUBLICATIONS

Korean Notice of Preliminary Rejection (with English Translation) dated Nov. 19, 2019 for Korean Application No. 10-2018-7023391; 12 Pages.
Response (with English Translation) to Korean Notice of Preliminary Rejection dated Nov. 19, 2019 for Korean Application No. 10-2018-7023391; Response filed Jan. 17, 2020; 26 Pages.
Taiwan Statement of Reasons for Reexamination dated on Jan. 13, 2020 for Taiwanese Application No. 107118892; 10 Pages.
European Communication Pursuant to Rules 161 and 162 dated Jan. 28, 2020 for European Application No. 18769870.9; 3 Pages.
International Preliminary Report on Patentability dated Jan. 2, 2020 for International Application No. PCT/US2018/034369; 10 Pages.
Notice of Allowance dated Dec. 17, 2019 for U.S. Appl. No. 16/530,056; 12 Pages.

BIPLANAR TAPERED LINE FREQUENCY SELECTIVE LIMITER

GOVERNMENT INTERESTS

This invention was made with government support under Contract No. W911NF-17-C-0031 awarded by the Defense Advanced Research Projects Agency (DARPA), administered by US Army ACC-APG-RTP. The government has certain rights in this invention.

TECHNICAL FIELD

This disclosure generally relates to a frequency selective limiter and more particularly to a frequency selective limiter having a biplanar transmission line structure.

BACKGROUND

As is known in the art, a Frequency Selective Limiter (FSL) is a nonlinear passive device that provides greater attenuation to signals above a predetermined threshold power level while signals below the threshold power level are not substantially attenuated. One feature of the FSL is the frequency selective nature of the high-power limiting: low power signals close in frequency to the limited signals are substantially unaffected (i.e., the FSL does not substantially attenuate such signals).

A typical implementation of an FSL includes a stripline transmission structure using two layers of dielectric material disposed about the stripline, with the stripline having a fixed length and a fixed width along the length of the FSL. Such structures are relatively simple to fabricate and provide adequate magnetic fields to realize a critical power level of approximately 0 dBm when using a single crystal material. One method of reducing the threshold power level is to use a lower-impedance stripline at the cost of degraded return loss. An external matching structure can be used to improve the impedance match, but this technique reduces the bandwidth and increases the insertion loss of the FSL.

Another approach to reducing the threshold power level is using a transmission line structure having a tapered width. M. Morton and G. Sollner in U.S. patent application Ser. No. 15/627,913 describe a frequency selective limiter (FSL) comprising a transmission line structure having a tapered width. The transmission line structure can be provided such that one or more conductors have a first width at a first end (e.g., an input) of the FSL and a second, different width at a second end (e.g., an output) of the FSL. Use of a tapered width transmission line results in a reduced insertion loss for a given threshold power without changing the structure of the magnetic material (e.g., ferrite material) disposed adjacent to the transmission line. However, this tapered transmission line structure supports narrower bandwidth than desired.

SUMMARY

The concepts, systems, and techniques disclosed herein are directed toward a frequency selective limiter (FSL) comprising a biplanar transmission line structure having a tapered width. Such a biplanar tapered line FSL may provide higher overall nonlinear performance without degrading the insertion loss for weak signals without changing the structure of the magnetic material, while still being able to operate over a wide a frequency range.

According to one illustrative embodiment of the present invention, a frequency selective limiter (FSL) may include a first magnetic material having first and second opposing surfaces. A first conductor may be disposed on the first surface of the first magnetic material, with a width of the first conductor decreasing from a first end of the FSL to a second end of the FSL along a length of the FSL. Two second conductors may be disposed on the second surface of the first magnetic material, with a width of a gap between the two second conductors decreasing from the first end of the FSL to the second end of the FSL along a length of the FSL.

In one variation of the illustrative embodiment, the width of the gap between the two second conductors may become zero at or before the second end of the FSL such that the two second conductors come into physical contact.

In one variation of the illustrative embodiment, the first conductor may correspond to a signal conductor for the FSL.

In one variation of the illustrative embodiment, the two second conductors may correspond to ground plane conductors for the FSL, and the first conductor may be located relatively at the center of the two second conductors.

In one variation of the illustrative embodiment, the width of the first conductor may decrease exponentially along a length of the FSL. Alternately, in one variation of the illustrative embodiment, the width of the first conductor may decrease linearly along a length of the FSL.

In another variation of the illustrative embodiment, the frequency selective limiter may further comprise multiple segments having one or more different characteristics from changes in the width of the first conductor or the width of a gap between the two second conductors. Herein, the characteristics from changes in the widths of each segment may be decided according to an attenuation factor of one or more preceding segments or a power threshold of the one or more preceding segments. In addition, each of the segments may form 50Ω transmission lines and the FSL may have a constant characteristic impedance along the length of the FSL. Furthermore, the power threshold of each segment may decrease along a length of the FSL. Moreover, each segment, when the power is incident on it is above its threshold, may provide the same level of attenuation as the other sections when the power incident on them is above their threshold.

In one variation of the illustrative embodiment, the first conductor and the two second conductors may comprise the same material. In another variation of the illustrative embodiment, the first conductor and the two second conductors may comprise different materials.

In one variation of the illustrative embodiment, the frequency selective limiter may further comprise a second magnetic material disposed onto the signal conductor such that the signal conductor is disposed between the first magnetic material and the second magnetic material. Herein, the first magnetic material and the second magnetic material may comprise the same material. Alternately, the first magnetic material and the second magnetic material may comprise different materials.

In a further variation of the above-mentioned variation, the frequency selective limiter further may comprise two second ground conductors on the surface of the second magnetic material, a width of a gap between the two second ground conductors decreasing from the first end of the FSL to the second end of the FSL along a length of the FSL. Herein, the first ground conductors and the second ground conductors may comprise the same material. Alternately, the first ground conductors and the second ground conductors may comprise different materials.

According to one illustrative method of the present invention, a method for forming a frequency selective limiter may include providing a magnetic material having first and second opposing surfaces and disposing a first conductor on the first surface of the magnetic material, with a width of the first conductor decreasing from a first end of the FSL to a second end of the FSL along a length of the FSL. The method may further include disposing two second conductors on the second surface of the magnetic material, with a width of a gap between the two second conductors decreasing from the first end of the FSL to the second end of the FSL along a length of the FSL.

In one variation of the illustrative method, the width of the gap between the two second conductors may become zero at of before the second end of the FSL.

In one variation of the illustrative method, the first conductor may correspond to a signal conductor for the FSL, and the two second conductors may correspond to ground plane conductors for the FSL and a centerline of the first conductor may be disposed along a midpoint between proximate edges of the two second conductors.

In one variation of the illustrative method, the width of the first conductor may decrease exponentially along a length of the FSL. In another variation of the illustrative method, the width of the first conductor may decrease linearly along a length of the FSL.

According to another illustrative embodiments of the present invention, a cascaded frequency selective limiter system may comprise: a first frequency selective limiter (FSL) comprising: a first magnetic material having first and second opposing surfaces; a first signal conductor disposed on the first surface of the first magnetic material, while a width of the first signal conductor decreasing from a first end of the first FSL to a second end of the first FSL along a length of the first FSL; and two first ground conductors disposed on the second surface of the first magnetic material, while a width of a gap between the two first ground conductors decreasing from the first end of the first FSL to the second end of the first FSL along a length of the first FSL. The cascaded frequency selective limiter system may further comprise: a second frequency selective limiter (FSL) including: a second magnetic material having first and second opposing surfaces; a second signal conductor disposed on the first surface of the second magnetic material, while a width of the second signal conductor decreasing from a first end of the second FSL to a second end of the second FSL along a length of the second FSL; and two second ground conductors disposed on the second surface of the second magnetic material, while a width of a gap between the two second ground conductors decreasing from the first end of the second FSL to the second end of the second FSL along a length of the second FSL. Herein, an output of the first FSL may be coupled to an input of the second FSL.

In one variation of another illustrative embodiment, the first and second magnetic materials may comprise the same material. In another variation of another illustrative embodiment, the first and second magnetic materials may comprise different materials. Furthermore, any of the first or second FSL may be a coplanar FSL. Moreover, the width of the gap between the two second conductors may stay constant along the length of the FSL The details of one or more embodiments of the disclosure are set forth in the accompanying drawings and the description below. Other features, objects, and advantages of the disclosure will be apparent from the description and drawings, and from the claims.

DESCRIPTION OF DRAWINGS

The advantages of the concepts described above, together with further advantages, may be better understood by referring to the following description together in conjunction with the accompanying drawings. The drawings are not necessarily to scale, emphasis instead generally being placed upon illustrating the principles of the claimed concepts.

Like reference symbols in the various drawings indicate like elements.

DETAILED DESCRIPTION

All relative descriptions herein, such as left, right, up, and down, are with reference to the Figures, and not meant in a limiting sense. Additionally, for clarity, common items and circuitry, such as integrated circuits, resistors, capacitors, transistors, and the like, have not been included in the Figures, as can be appreciated by those of ordinary skill in the pertinent art. Unless otherwise specified, the illustrated embodiments may be understood as providing example features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed concepts, systems, or methods. Additionally, the shapes and sizes of components are intended to be only illustrative and unless otherwise specified, can be altered without materially affecting or limiting the scope of the concepts sought to be protected herein.

Figure 1A:
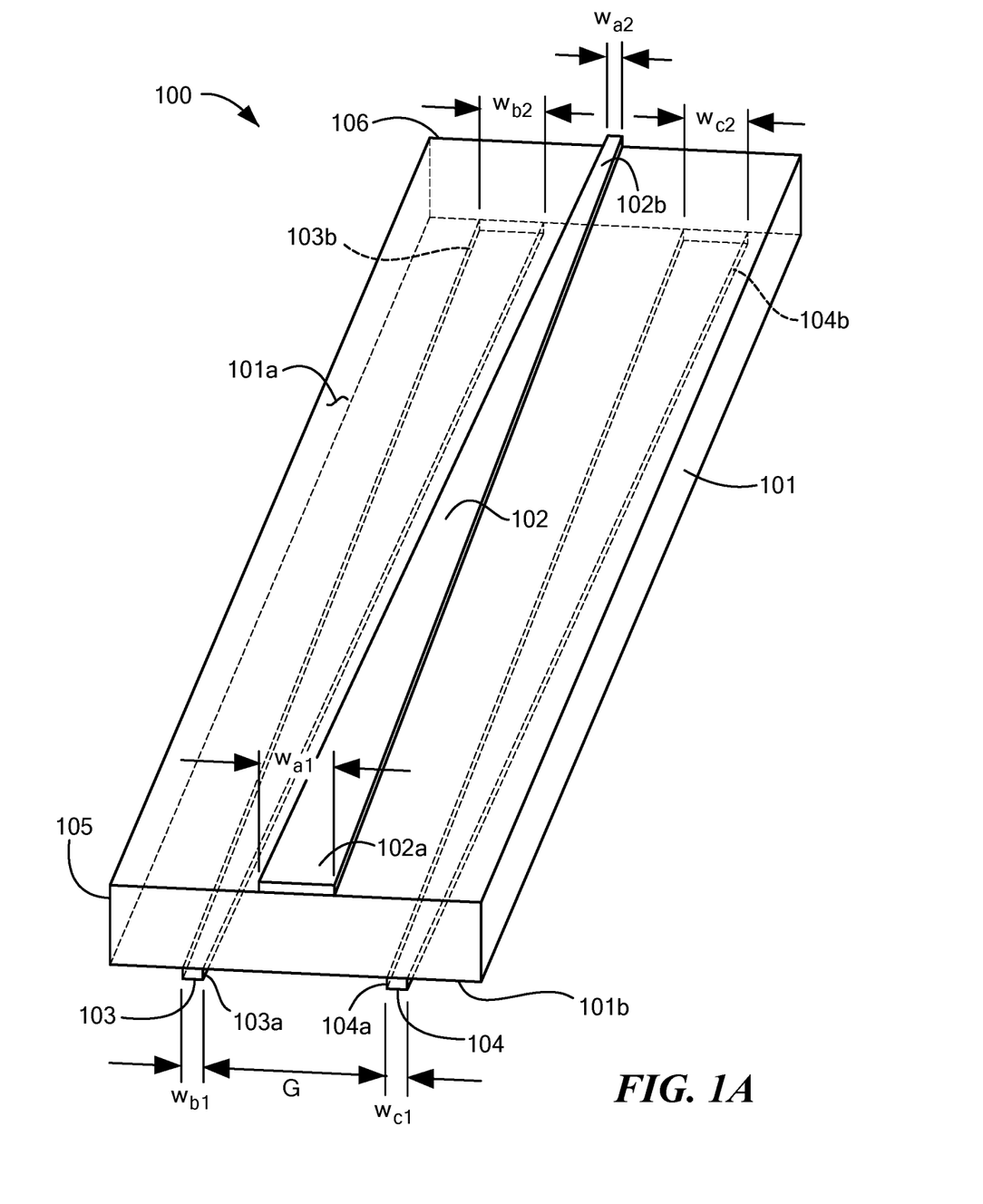
FIG. 1A illustrates an isometric view of a Frequency Selective Limiter (FSL) having a biplanar waveguide transmission line structure with a tapered width.

Referring now to FIG. 1A, a frequency selective limiter (FSL) 100 may include a magnetic material substrate 101, a first conductor 102, and two second conductors 103, 104. The magnetic material 101 may have a first surface 101a and a second surface 101b. The first conductor 102 may correspond to a center (or signal) conductor and the two second conductors 103, 104 may correspond to two ground plane conductors. The first conductor 102 is disposed on the first surface 101a of the magnetic material substrate 101 and the two second conductors are disposed on the second surface 101b. The first conductor 102 and the second conductors 103, 104 may form a so-called biplanar waveguide transmission line.

The magnetic material substrate 101 may include a ferromagnetic material, such as Yttrium iron garnet (YIG). For example, the magnetic material 101 may include at least one of a single crystal (SC) YIG, polycrystalline (PC) YIG, hexagonal ferrite, or a variety of doped YIG materials, such as calcium vanadium garnet (CVG), Lithium Ferrite, or Nickel Zinc Ferrite.

The FSL may have a first end 105 and a second end 106 along a length of the FSL. In one illustrative embodiment, the first end may correspond to an input of the FSL and the second end 106 may correspond to an output of the FSL.

The first conductor may be formed or otherwise provided having a tapered width. For example, a width of the first conductor 102 may be reduced from $W_{a1}$ to $W_{a2}$ along the length of the FSL 100 from the first end 105 to the second end 106, where $W_{a1}$ is greater than $W_{a2}$. At the same time, widths of the second conductors may increase from $W_{b1}$ to $W_{b2}$ and $W_{c1}$ to $W_{c2}$ respectively along the length of the FSL 100 from the first end 105 to the second end 106, where $W_{b2}$ is greater than $W_{b1}$ and $W_{c2}$ is greater than $W_{c1}$.

The width of a gap width G between the two second conductors 103 and 104 may be reduced along the length of the FSL 100. In an illustrative embodiment, the gap width between the two second conductors 103, 104 may become zero at or before the second end 106 of the FSL 100 such that the two second conductors 103, 104 touch each other. Accordingly, the two second conductors may form a microstrip line at or before the second end 106 of the FSL 100.

In an embodiment, the width of the first conductor 102 may be related to the power threshold, so the width of the first conductor 102 may be reduced over the length of the FSL 100 (e.g., a length of the device). At the same time, the gap width G between the two second conductors 103, 104 may be reduced, so that the biplanar transmission line created from the combination of the first conductor 102 and the second conductors 103, 104 maintain a desired characteristic impedance such as a 50-ohm (50Ω) characteristic impedance. At the first end 105 of the FSL 100, a wider first (or signal) conductor width and a wider gap between the second (or ground) conductors correspond to a higher power threshold and a lower insertion loss. In this way the FSL insertion loss is minimized for signals below the FSL power threshold, which is determined by the minimum width of the first conductor.

The combination of each of these elements can define the characteristic impedance of FSL 100. For example, by modifying the width of first conductor 102 without changing the width of gap width G may lead to a characteristic impedance other than 50 ohms. Thus, it should be appreciated that in some embodiments, tapering the width of first conductor 102, as used herein may refer to tapering the width of first conductor 106 and tapering (or otherwise modify the width) of gap width G to maintain a 50-ohm characteristic impedance.

The width of the first conductor 102 may be reduced linearly or exponentially along the length of the FSL 100. The widths of the second conductors 103, 104 also may be reduced linearly or exponentially along the length of the FSL 100. Furthermore, the gap width G between the second conductors 103, 104 may be changed linearly or exponentially along the length of the FSL 100. In an embodiment, the widths of the second conductors 103, 104 may be selected based at least in part on a gap width G between the second conductors 103, 104.

In embodiments, the first conductor 102 may be centrally disposed between the two second conductors if the FSL is viewed from the top. That is, a center line of the first conductor 102 is disposed along a midpoint between proximate edges 103b, 104b of the second conductors 103, 104. As the edges 103b, 104b of the second conductors 103, 104 are brought closer at the second end 106 of the FSL, the first conductor 102 and the second conductors 103, 104 may overlap with each other.

It should be appreciated that in other embodiments, the width of the first conductor 102 may increase (e.g., linearly, exponentially) along the length of FSL 100 from first end 105 to second end 106. However, in such an embodiment, the threshold level would increase at that point above the power level where the desired limiting would occur. Thus, this segment of the FSL would only add to small signal loss and not contribute to the desired large signal attenuation.

In an embodiment, the first conductor 102 and the second conductors 103, 104 may be provided from the same material. In some embodiments, the first conductor 102 and the second conductors 103, 104 may be provided from different materials. In another embodiment, the first conductor 102 and the second conductors 103, 104 may include a metal or metallic material.

Figure 1B:
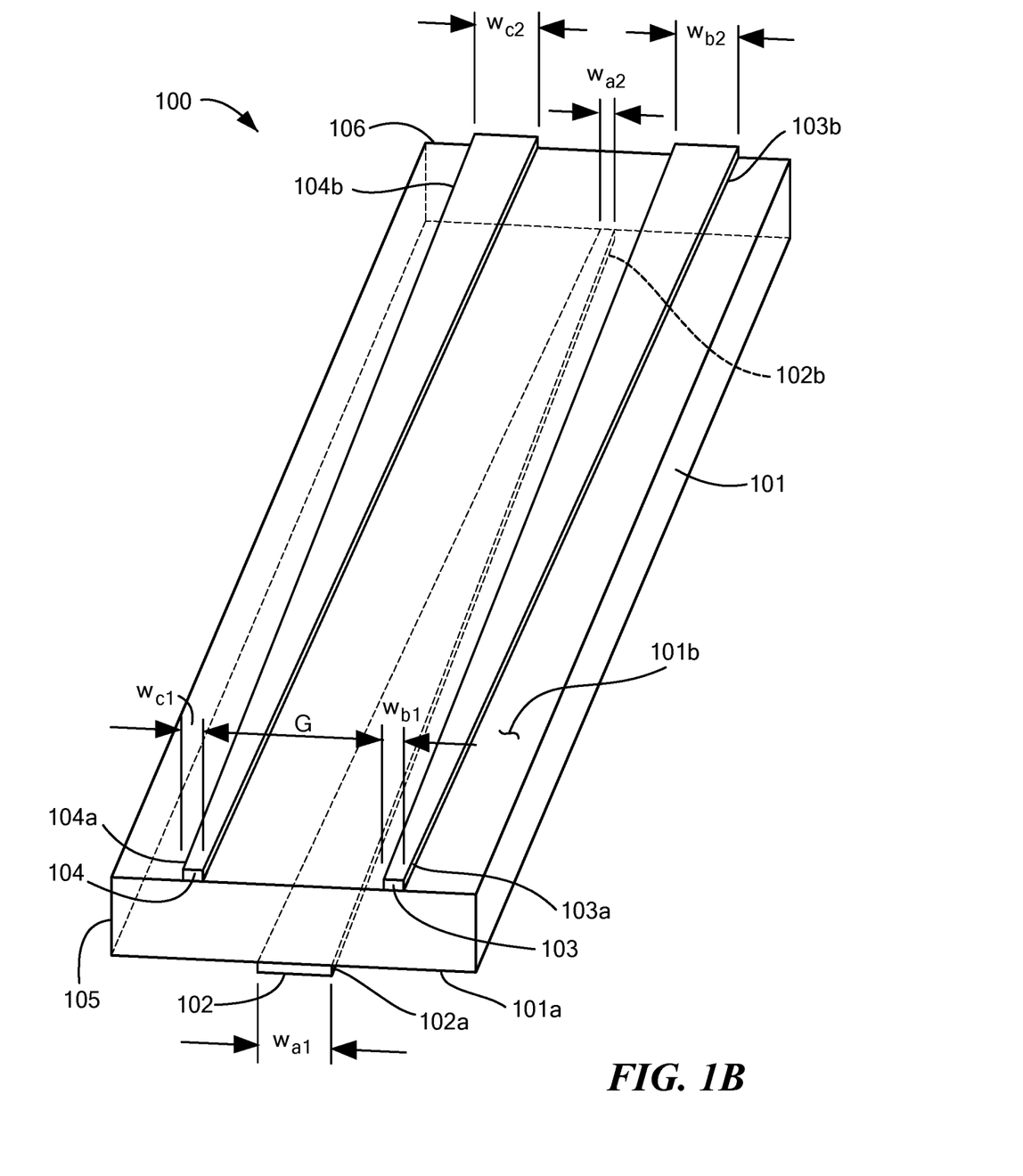
FIG. 1B illustrates an isometric view of a biplanar FSL when the FSL is viewed from the bottom.

Referring now to FIG. 1B, when the biplanar FSL in FIG. 1A is viewed from the bottom, the FSL includes a magnetic material substrate 101, a first conductor 102, and two second conductors 103, 104. The magnetic material 101 has a first surface 101a and a second surface 101b. The two second conductors 103, 104 are disposed on the second surface 101b, and the first conductor 102 is disposed on the first surface 101a of the magnetic material substrate 101.

Figure 2:
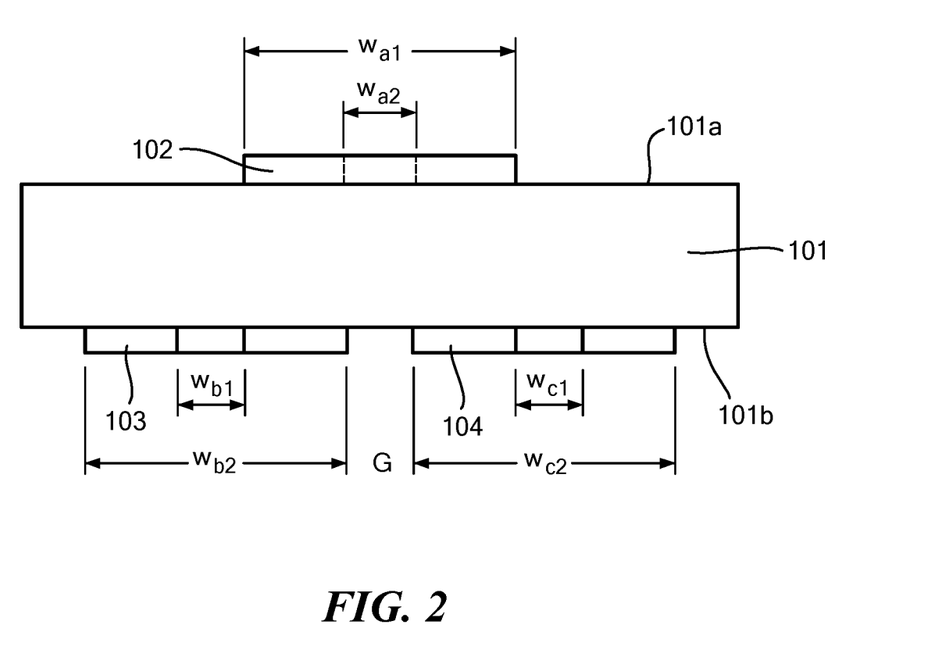
FIG. 2 illustrates a side view of a biplanar FSL.

Referring now to FIG. 2, a frequency selective limiter (FSL) 100 may include a magnetic material substrate 101, a first conductor 102, and two second conductors 103, 104. The first conductor is disposed on a first surface 101a of the magnetic material 101 and the two second conductors are disposed on a second surface 101b of the magnetic material 101. The first conductor 102 and the second conductors 103, 104 may form a biplanar waveguide transmission line.

The first conductor may be formed or otherwise provided having a tapered width. For example, a width of the first conductor 102 may be reduced from $W_{a1}$ to $W_{a2}$ along the length of the FSL 100 from the first end 105 (FIG. 1A) to the second end 106 (FIG. 1A), where $W_{a1}$ is greater than $W_{a2}$. At the same time, widths of the second conductors may increase from $W_{b1}$ to $W_{b2}$ and $W_{c1}$ to $W_{c2}$ respectively along the length of the FSL 100 from the first end 105 to the second end 106, where $W_{b2}$ is greater than $W_{b1}$ and $W_{c2}$ is greater than $W_{c1}$.

The gap width G between the two second conductors 103 and 104 may be reduced along the length of the FSL 100. In an illustrative embodiment, the gap width between the two second conductors 103, 104 may become zero at or before the second end 106 of the FSL 100 such that the two second conductors 103, 104 contact each other.

In an embodiment, the first conductor 102, the second conductors 103, 104, and gap width G may be divided into multiple segments or portions from the first end 105 to the second end 106 of the FSL 100. The first conductor 102, the second conductors 103, 104, and gap width G may have a different width than a preceding or subsequent segment of the first conductor 102, the second conductors 103, 104, and gap width G, respectively. Segments for the first conductor 102, the second conductors 103, 104, and gap width G may refer to the first conductor, second conductors, and gap individually or in different combinations with each other. For example, a segment of FSL 100 may refer and thus include a width of the first conductor 102 and a width of gap width G between the second conductors 103, 104. It should be appreciated that FSL 100 can be described as having segments to more clearly describe what is happening along the length of FSL 100, by discussing the width at discrete cross sections of FSL 100. In other words, the physical implementation of FSL 100 can be a limit where the length of a segment is zero (not discretized). For example, in some embodiments, FSL 100 may include a single continuous structure having a continuous, smooth transition in width from the first end 105 to the second end 106.

In some embodiments, each segment of the first conductor 102 may have a narrower width than a previous segment to match a power threshold of an attenuated signal's power level (attenuated by the previous one or more segments) and have a correspondingly lower power threshold than the previous segment. Thus, each individual segment of first conductor 102 can be formed having a width that matches its respective power threshold level to the expected large signal power level incident upon that respective segment, where the incident power of the respective segment is a function of the large signal attenuation of one or more previous segments of first conductor 102.

Now referring to FIGS. 3A-3D, top views of different biplanar waveguide transmission lines are provided having tapered widths in different configurations. The tapered width coplanar waveguide transmission line as described herein can be formed in a variety of different shapes based at least in part on a particular application of a respective FSL.

Figure 3A:
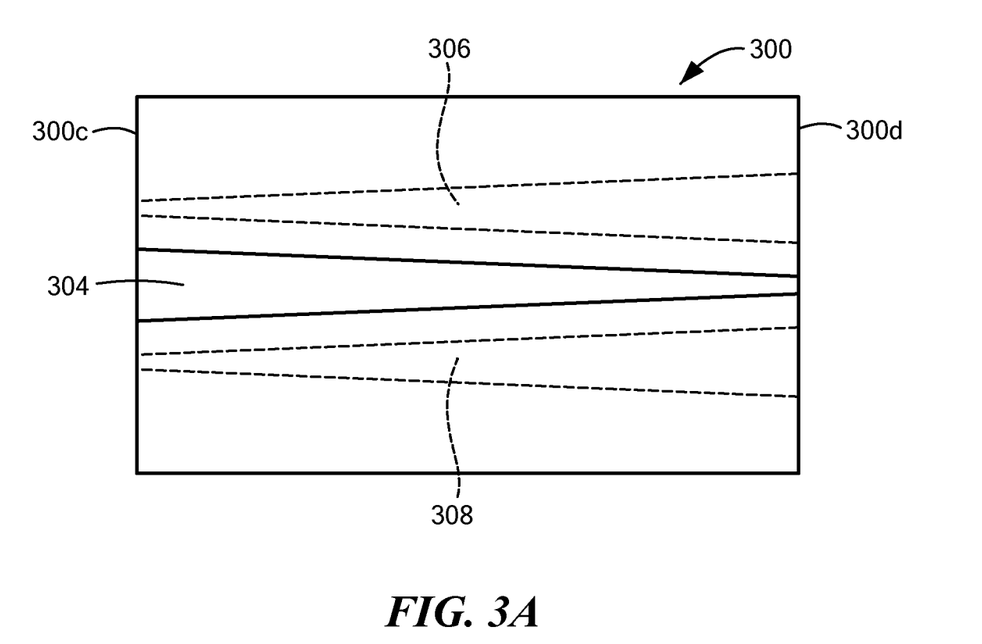
FIG. 3A illustrates a top view of an FSL having a biplanar waveguide transmission line structure with a linearly tapered width.

For example, and referring to FIG. 3A, a biplanar FSL 300 includes a biplanar waveguide transmission line with a linearly tapered width. In the illustrative embodiment of FIG. 3A a width of a first conductor 304 linearly decreases from a first end 300c to a second end 300d of FSL 300 and a width of each of second conductors 306, 308 linearly increases from the first end 300c to the second end 300d of FSL 300.

Figure 3B:
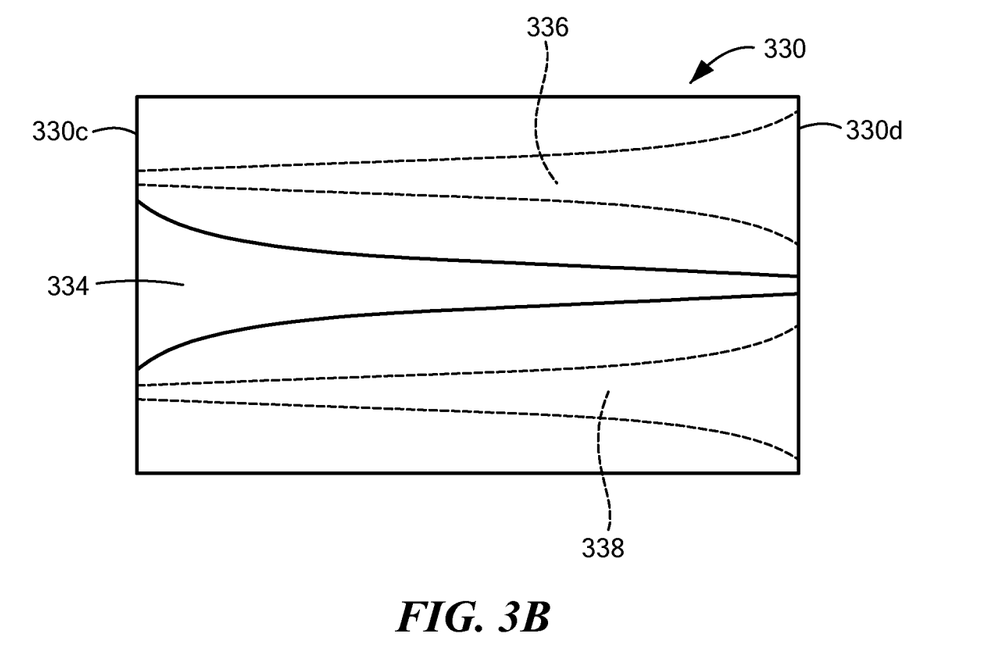
FIG. 3B illustrates a top view of an FSL having a biplanar waveguide transmission line structure with an exponentially tapered width.

Referring now to FIG. 3B, a biplanar FSL 330 includes a biplanar waveguide transmission line with an embodiment of an exponentially tapered width. Herein, a width of a first conductor 334 exponentially decreases from a first end 330c to a second end 330d of FSL 330 and a width of each of first and second conductors 336, 338 exponentially increases from the first end 330c to the second end 330d of FSL 330.

Figure 3C:
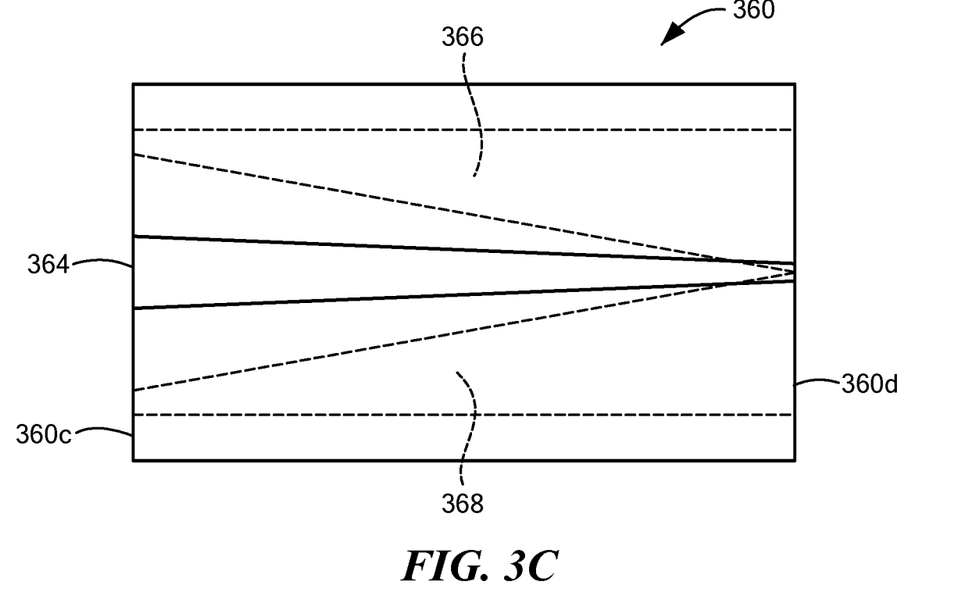
FIG. 3C illustrates a top view of a biplanar FSL having ground conductors which are in physical contact at an end of the FSL.

Referring now to FIG. 3C, a biplanar FSL 360 includes a biplanar waveguide transmission line with another embodiment of a linearly tapered width. In the illustrative embodiment of FIG. 3C, a width of a first conductor 364 linearly decreases from a first end 360c to a second end 360d of FSL 360 and a width of each of two conductors 366, 368 linearly increases from the first end 360c to the second end 360d of the FSL 360. In this embodiment, the with of the two conductors 366, 368 grow, and the gap width G decreases to the point that the two second conductors 366, 368 touch each other at the second end 360d of the FSL 360. In addition, the first conductor 364 may overlap with the two second conductors 366, 368. In this case, the first conductor 364 may be disposed relatively at the center of the two second conductors 366, 368.

It should be appreciated that the tapered width biplanar waveguide transmission lines as described herein can be formed in a variety of different shapes based at least in part on dimensions of the FSL (e.g., length), a power threshold level, insertion loss factor and/or attenuation range of a respective FSL. The combination of these parameters may determine the optimal taper width. Thus, the tapered width biplanar waveguide transmission lines can be designed and formed based at least in part on a particular application of the respective FSL and to meet specific requirements of at least one of or a combination of the following factors: dimensions of the FSL (e.g., length), a power threshold level, insertion loss factor and/or attenuation range.

Figure 3D:
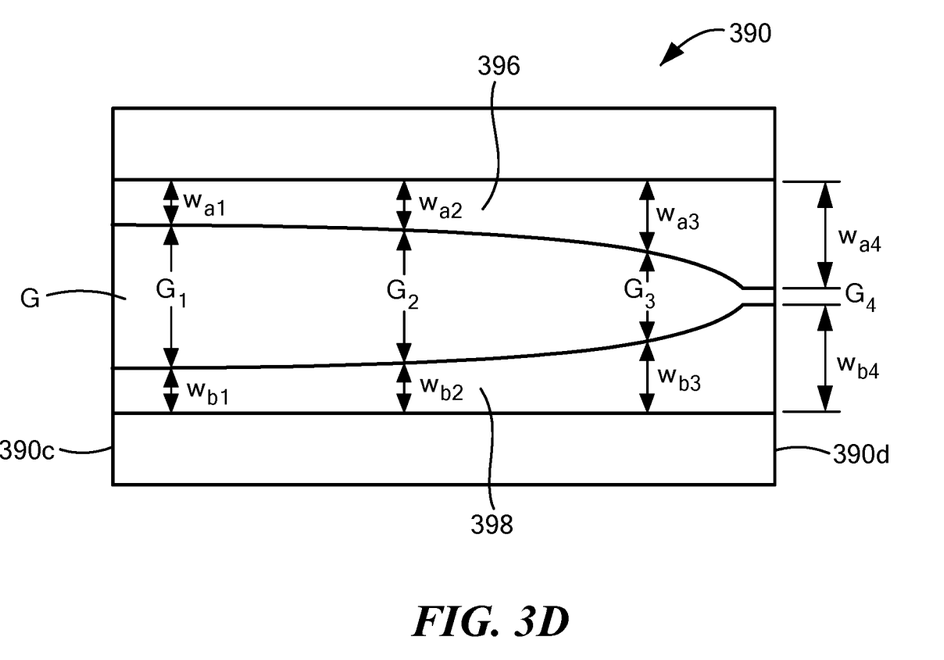
FIG. 3D illustrates a top view of a biplanar FSL having multiple segments.

Now referring to FIG. 3D, a top view of a top view of FSL 390 illustrates one example embodiment of the tapered width of the biplanar waveguide transmission structure having multiple segments. In the illustrative embodiment of FIG. 3D, the width of G varies (here decreases) along the length of FSL 300 from first end 390c to second end 390d.

In an embodiment, the first conductor 394, the second conductors 396, 398, and gap width G may be divided into multiple segments or portions from the first end 390c to second end 390d of the FSL 390. The first conductor 394, the second conductors 396, 398, and gap width G may have a different width than a preceding or subsequent segment of the first conductor 394, the second conductors 396, 398, and gap width G, respectively. Segments for the first conductor, the second conductors, and the gap may refer to the first conductor, second conductors, and gap individually or in different combinations with each other.

For example, the first gap between two second conductors 396, 398 may have a first length $G_1$ at the first segment of FSL 390, a second length $G_2$ at the second segment of FSL 390 and a third length $G_3$ at the third segment of FSL 390. Finally, the gap width G may decrease to $G_4$ at the second end 390d of the FSL 390. In some embodiments, the gap width $G_4$ at the second end 390d may be zero, such that the two second conductors 396, 398 may touch each other at the second end 390d.

The widths of two second conductors 396, 398 may change at the same time. That is, the widths of the two second conductors 396, 398 may change at some physical positions along the length of the FSL. The two second conductors 396, 398 may have width $W_{a1}$ and $W_{b1}$ at the first segment of FSL 390 respectively. The widths of two second conductors 396, 398 may change to $W_{a1}$ and $W_{b2}$ at the second segment, and $W_{a3}$ and $W_{b3}$ at the third segment respectively. Finally, the widths of two second conductors 396, 398 may be reduced to $W_{a4}$ and $W_{b4}$ at the second end 390d of the FSL 390.

As illustrated above, the gap width G may decrease along the length of the FSL 390 from first end 390c to second end 390d. However, it should be appreciated that in other embodiments, the width of the gap width G may stay constant along the length of the FSL 390 from first end 390c to second end 390d. In the case, the width of the second conductors 396, 398 may change to achieve desired characteristic impedance for each segment of the FSL 390.

In some embodiments, an end portion 399 (e.g., output portion) of the gap width G may have a constant or substantially constant width. For example, and as illustrated in FIG. 3D, end portion 399 has a substantially constant width $G_4$ in the last segment of the FSL 390. End portion 399 may be designed based at least in part on a device or instrument FSL 390 is coupled to. For example, in some applications, FSL 390 may be coupled to a low noise amplifier (LNA) module and the shape and/or width of the end portion 399 can be designed to couple to the LNA (or other types of devices FSL 390 can be coupled to). Thus, it should be appreciated that the dimensions, shape and/or width of end portion 399 can be selected based at least in part on a device or instrument that FSL 390 is to be coupled with.

Figure 4:
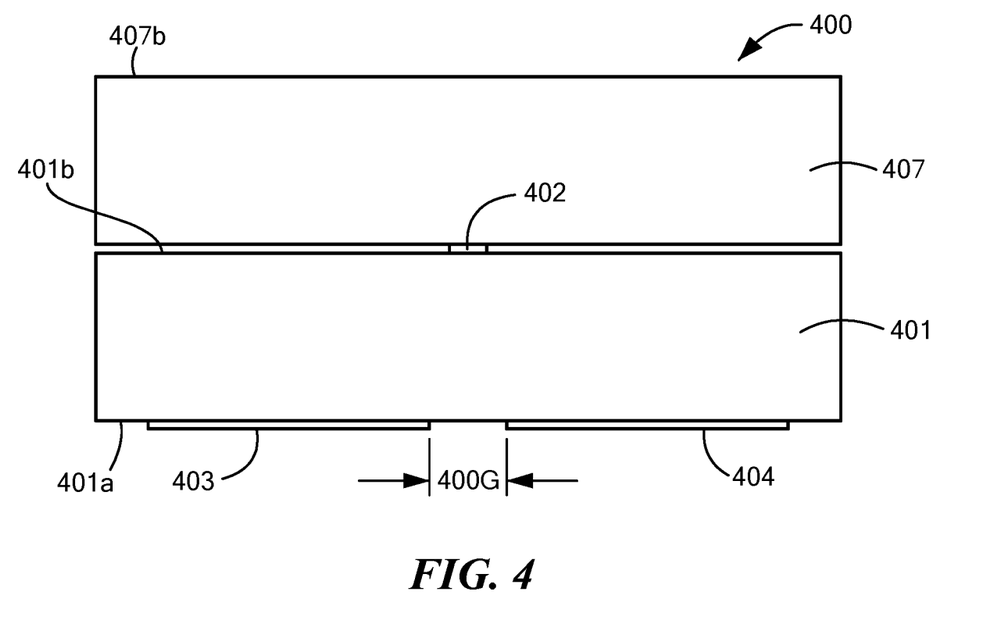
FIG. 4 illustrates a side view of an FSL having a first and a second magnetic materials.

Now referring to FIG. 4, a frequency selective limiter (FSL) 400 includes a first magnetic material substrate 401, a signal conductor 402, and two ground conductors 403, 404. The signal conductor is disposed on a first surface 401a of the first magnetic material 401 and the two ground conductors 403, 404 are disposed on a second surface 401b of the first magnetic material 401. The signal conductor 402 and the two ground conductors 403, 404 may form a biplanar waveguide transmission line.

The signal conductor may be formed or otherwise provided having a tapered width. For example, a width of the signal conductor 402 may be varied (e.g., reduced) along the length of the FSL 400 from the first end to the second end. At the same time, widths of the ground conductors may be varied (e.g., increase) along the length of the FSL 400. In another embodiment, widths of the ground conductors 403, 404 may stay the same along the length of the FSL 400.

The gap 400G between the two ground conductors 403, 404 may be reduced along the length of the FSL 400. In an illustrative embodiment, the gap 400G between the two ground conductors 403, 404 may become zero at the second end (e.g., output portion) of the FSL 400 such that the two ground conductors 403, 404 contact each other.

A second magnetic material substrate 407 may be disposed on the second surface 401b of the first magnetic material substrate 401, such that the signal conductor 402 may be disposed (or sandwiched) between the first magnetic material 401 and the second magnetic material 407. In this embodiment, the second magnetic material 407 does not have a conductor disposed on the second magnetic material 407. The purpose of the second magnetic material 407 is to capture the fields from the RF signal guided by the biplanar waveguide transmission line that would otherwise be in the air. The transmission line does not actually generate the field, but it may define the characteristics of the field. The second magnetic material may capture the fields guided by the biplanar waveguide transmission line that would otherwise be in the air.

In an embodiment, the first magnetic material 401 and the second magnetic material 407 may comprise the same material. In another embodiment, the first magnetic material 401 and the second magnetic material 407 may comprise a different material. For example, the first magnetic material may be one that supports relatively lower manufacturing cost such as PC YIG, while the second structure may be one that presents greater manufacturing challenges for metalized substrates such as a thin SC YIG substrate. In this manner, the higher relative performance of the SC YIG material can be combined with the lower manufacturing complexity of the PC YIG material. Another example would be using CVG as the second substrate, as the higher power threshold relative to the PC YIG substrate used for the first material would lead to a wider range of power levels that could be limited simultaneously by the two different materials in the same segment of the FSL.

Figure 5:
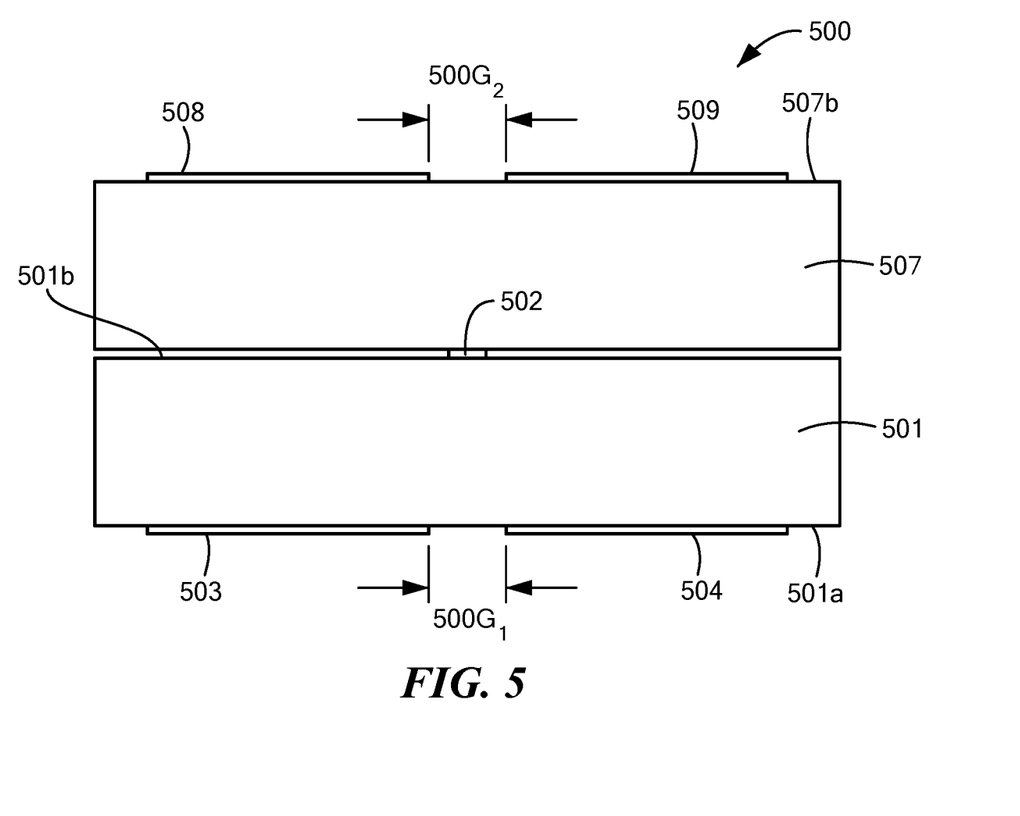
FIG. 5 illustrates a side view of an FSL having a tri-planar waveguide transmission line structure.

Now referring to FIG. 5, a frequency selective limiter (FSL) 500 includes a first magnetic material substrate 501, a signal conductor 502, and two first ground conductors 503, 504. The signal conductor 501 is disposed on a first surface 501a of the first magnetic material 501 and the two first ground conductors 503, 504 are disposed on a second surface 501b of the first magnetic material 501.

The signal conductor may be formed or otherwise provided having a tapered width. For example, a width of the signal conductor 502 may be reduced along the length of the FSL 500 from the first end to the second end. At the same time, widths of the first ground conductors 503, 504 may increase along the length of the FSL 500. In another embodiment, widths of the first ground conductors 503, 504 may stay the same along the length of the FSL 500.

The gap $500G_1$ between the two first ground conductors 503, 504 may be reduced along the length of the FSL 500. In an illustrative embodiment, the gap $500G_1$ between the two first ground conductors 503, 504 may become zero at or before the second end (e.g., output portion) of the FSL 500 such that the two first ground conductors 503, 504 contact each other.

A second magnetic material substrate 507 may be disposed on the second surface 501b of the first magnetic material substrate 501, such that the signal conductor 502 may be disposed (or sandwiched) between the first magnetic material 501 and the second magnetic material 501. Two second ground conductors 508, 509 are disposed on a second surface 507b of the second magnetic material 507. Widths of the second ground conductors 508, 509 may vary (e.g., increase) along the length of the FSL 500. In another embodiment, widths of the second ground conductors 508, 509 may stay the same along the length of the FSL 500. The gap $500G_2$ between the two second ground conductors 508, 509 may vary (e.g., reduced) along the length of the FSL 500. In an illustrative embodiment, the gap $500G_2$ between the two second ground conductors 508, 509 may become zero at the second end (e.g., output portion) of the FSL 500 such that the two second ground conductors 508, 509 contact each other. The signal conductor 502, the first ground conductors 503, 504, and the two second ground conductors 508, 509 may form a tri-planar waveguide transmission line. In addition, the second magnetic material 507 may capture the fields from the RF signal that would otherwise be in the air.

In an embodiment, the first magnetic material 501 and the second magnetic material 507 may comprise the same material. In another embodiment, the first magnetic material 501 and the second magnetic material 507 may comprise a different material.

In an embodiment, the first ground conductors 504, 504 and the second ground conductors 508, 509 may comprise the same material. Alternately, the first ground conductors 504, 504 and the second ground conductors 508, 509 may comprise a different material.

Figure 6:
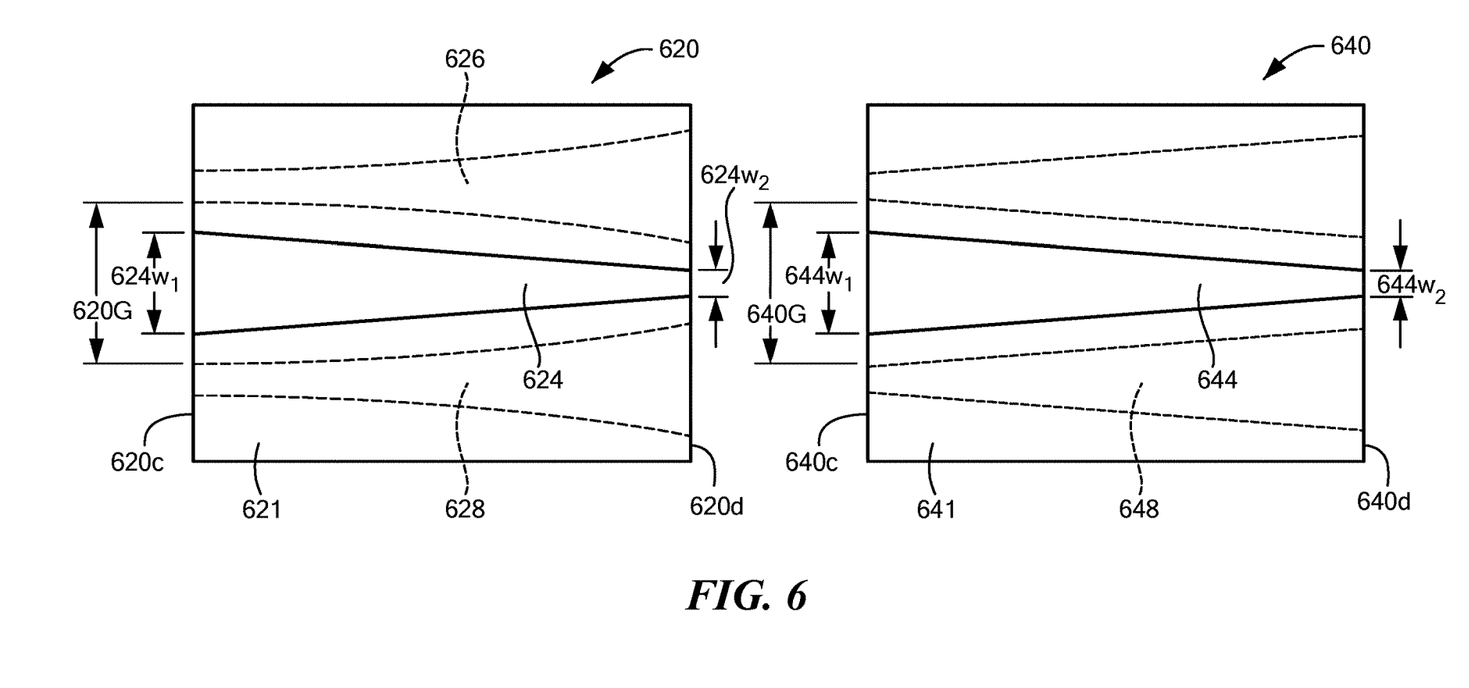
FIG. 6 is a top view of a cascaded FSL having at least two biplanar waveguide transmission line structures coupled together.

Now referring to FIG. 6, a cascaded FSL 600 may include a first FSL 620 and a second FSL 640, where an output 620d of the first FSL 620 is coupled to an input 640c of the second FSL 640. In an embodiment, cascaded FSL 600 may be configured to operate and attenuate signals the same, or in a substantially similar fashion as FSL 100 of FIG. 1A, however, cascaded FSL 600 may include two or more FSLs (here two are shown).

Each of FSLs 620, 640 include a biplanar waveguide transmission line having a tapered width. The first FSL 620 may include a first signal conductor 624 and two first ground plane conductors 626, 628. The first signal conductor 624 is disposed on a first surface of a first magnetic material substrate 621 and the two ground conductors 626, 628 are disposed on a second surface (not shown) of the first magnetic material 621. The signal conductor 624 and the two ground conductors 626, 628 form a biplanar waveguide transmission line.

The first FSL 620 may have a first end 620c and a second end 620d along a length of the FSL 620. In one illustrative embodiment, the first end 620c may correspond to an input of the first FSL 620 and the second end 620*d* may correspond to an output of the FSL.

The first signal conductor 624 may be formed or otherwise provided having a tapered width. For example, a width of the first signal conductor 624 may be reduced along the length of the FSL 620 from the first end 620*c* to the second end 620*d*. At the same time, widths of the first ground conductors 626, 628 may increase along the length of the first FSL 620.

The gap 620G between the two second conductors 626 and 628 may be reduced along the length of the FSL 620. In an illustrative embodiment, the gap 620G may become zero at or before the second end 620*d* of the FSL 620 such that the two first ground conductors 626, 628 contact each other at the second end 620*d*. Accordingly, the two second ground conductors 626, 628 may form a microstrip line at the second end 620*d* of the FSL 620.

The width of the first signal 624 may be reduced linearly or exponentially along the length of the first FSL 620. The widths of the first ground conductors 626, 628 also may be reduced linearly or exponentially along the length of the first FSL 620. Furthermore, the gap 620G between the first ground conductors 626, 628 may be changed linearly or exponentially along the length of the first FSL 620. In an embodiment, the widths of the ground conductors 626, 628 may be selected based at least in part on a gap 620G between the first ground conductors 626, 628.

The second FSL 640 may include a second signal conductor 644 and two second ground plane conductors 646, 648. The second signal conductor 644 is disposed on a first surface of a second magnetic material substrate 641 and the two second ground conductors 646, 648 are disposed on a second surface (not shown) of the second magnetic material 641. The first signal conductor 644 and the two second ground conductors 646, 648 form a biplanar waveguide transmission line.

The second FSL 640 may have a first end 640*c* and a second end 640*d* along a length of the FSL 640. In one illustrative embodiment, the first end 640*c* may correspond to an input of the second FSL 640 and the second end 640*d* may correspond to an output of the FSL.

The second conductor may be formed or otherwise provided having a tapered width. For example, a width of the second signal conductor 644 may be reduced along the length of the FSL 640 from the first end 640*c* to the second end 640*d*. At the same time, widths of the second ground conductors 646, 648 may increase along the length of the second FSL 640.

The gap 640G between the two second conductors 646 and 648 may be reduced along the length of the FSL 640. In an illustrative embodiment, the gap 640G may become zero at or before the second end 640*d* of the FSL 640 such that the two second ground conductors 646, 648 contact each other at the second end 640*d*. Accordingly, the two second ground conductors 646, 648 may form a microstrip line at the second end 640*d* of the FSL 640.

The width of the second signal 644 may be reduced linearly or exponentially along the length of the second FSL 640. The widths of the second ground conductors 646, 648 also may be reduced linearly or exponentially along the length of the second FSL 640. Furthermore, the gap 640G between the second ground conductors 646, 648 may be changed linearly or exponentially along the length of the second FSL 640. In an embodiment, the widths of the ground conductors 646, 648 may be selected based at least in part on a gap 640G between the second ground conductors 646, 648.

In an embodiment, the width of the first signal conductor 624 and the second signal conductors 644 may be related to the power threshold, so the width of the first signal conductor 624 the second signal conductors 644 may be reduced over the length of the FSLs 620, 640 respectively. At the same time, the gaps 620G, 640G between the first ground conductors 626, 628 and the second ground conductors 646, 648 may be reduced, so that the biplanar transmission lines created from the combination of the signal conductor and the ground conductors maintain a 50-ohm (50Ω) characteristic impedance. In this way the FSL insertion loss is minimized for signals below the FSL power threshold, which is determined by the minimum width of the first conductor.

In some embodiments, first and second FSLs 620, 640 may include the same material. In other embodiments, one or more portions of first and second FSLs 620, 640 may include different material. For example, the first magnetic material 621 of the first FSL 620 and the second magnetic material 641 of the second FSL 640 may comprise the same material. Alternately, the first magnetic material 621 of the first FSL 620 and the second magnetic material 641 of the second FSL 640 may comprise different material.

The first and second magnetic materials 621, 641 may include a ferromagnetic material, such as Yttrium iron garnet (YIG). For example, first and second magnetic materials 621, 641 may include at least one of a single crystal (SC) YIG, a polycrystalline (PC) YIG, a hexagonal ferrite, or a variety of doped YIG materials. Alternately, the first and second magnetic materials 621, 641 may also be calcium vanadium garnet (CVG), Lithium Ferrite, or Nickel Zinc Ferrite.

In one illustrative embodiment, first FSL 620 can be formed having a PC-YIG magnetic material and second FSL 640 can be formed having a SC-YIG magnetic material respectively. As PC-YIG and SC-YIG have different power thresholds, the dimensions of first and second FSLs 620, 640 may be different based at least in part of these different properties and a respective position (e.g., first, middle, last) within the cascaded FSL 600. For example, a length of the first FSL 620 measured from input 620*c* to output 620*d* may be different (greater than, less than) than a length of the second FSL 640 measured from input 640*c* to output 640*d*.

The dimensions of signal conductors 624, 644 and ground plane conductors 626, 628, 646, 648 can be different based at least in part of the different properties of first and second magnetic materials 621, 641 and a respective position (e.g., first, middle, last) within the cascaded FSL 600. For example, first width 644$w_1$ of the second signal conductor 644 at the first end (i.e., input) 640*c* of the second FSL 640 may be selected based in part on the second width 624$w_2$ of the first signal conductor 624 at the second end (i.e., output) 620*d* of first FSL 620 and the properties of the SC-YIG material. In some embodiments, the first width 644$w_1$ of the second signal conductor 644 at input 640*c* may be greater than the second width 624$w_2$ of the first signal conductor 624 at output 620*c*. In other embodiments, the first width 644$w_1$ of the second signal conductor 644 at input 640*c* may be equal to or less than the second width 624$w_2$ of the first signal conductor 624 at output 620*c*.

In some embodiments, the dimensions (e.g., length, width) of the first and second FSLs 620, 640 may be the same. In other embodiments, one or more dimensions of the first FSL 620 may be different from one or more dimensions of the second FSL 640. For example, a total length of the first FSL 620 may be greater than or less than a total length of the second FSL 640.

In an embodiment, the SC-YIG material may be more expensive than the PC-YIG material. Thus, cost advantages can be achieved by forming cascaded FSL 600 using a combination of materials, such as a combination of SC-YIG material and PC-YIG material as opposed to only SC-YIG material. For example, portions of the cascaded FSL 600 can be formed using the less expensive PC-YIG material (here first FSL) and thus use less of the more expensive SC-YIG material, while achieving the desired performance (e.g., signal attenuation) of cascaded FSL 600.

It should be appreciated that although FIG. 6 illustrates cascaded FSL 600 having two FSLs, in other embodiments, a cascaded FSL may include more than two FSLs. In should also be appreciated that although the cascaded FSL in FIG. 6 comprises two biplanar FSLs, in some embodiments, a cascaded FSL 600 may comprise a combination of a biplanar FSL and a coplanar FSL. In the same way, a cascaded FSL 600 may comprise a combination of a biplanar FSL and a tri-planar FSL described in FIG. 5.

The biplanar tapered line FSL proposed herein may provide significant improvements in performance over the traditional FSLs without requiring modification to the material engineering. By designing the ratio of tapering for signal conductor and ground conductor to match the power threshold to the limited signal power along the length of the device, each portion of the FSL may be presented with a power level that is highly attenuated (and ideally maximally attenuated) with a relatively low insertion loss for small signals, while simultaneously ensuring that overdriving portions of the FSL are reduced (and ideally minimized or even eliminated). This structure may enable improvements to insertion loss and overall power threshold, as well as increasing the notch filter quality factor compared to conventional tapered and un-tapered FSL designs. By forming the line on two planes, the RF H-field can be engineered to be most compatible with parallel DC H-field biasing, where lower magnetostatic surface wave (MSW) and power threshold dispersion supports multi-octave operation. Furthermore, the proposed biplanar tapered line solution can be compatible with all forms of FSL materials, including hybrid assemblies that utilize multiple types of ferrite material within the same FSL component.

In more detail, unlike the coplanar waveguide (CPW) tapered FSLs, the biplanar FSL maintains an RF H-field that has stronger parallel components similar to what would be seen with a microstrip line, and hence, the biplanar FSL can be used with parallel biasing. Parallel biasing leads to wide bandwidth operation because it minimizes or eliminates the frequency bandwidth where undesirable loss to MSW occurs, and because the power threshold dispersion is reduced compared to the perpendicular biasing required by the previous CPW tapered FSLs.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Accordingly, other embodiments are within the scope of the following claims.

What is claimed is:

1. A frequency selective limiter (FSL) comprising:
    a first magnetic material having first and second opposing surfaces;
    a first conductor disposed on the first surface of the first magnetic material, a width of the first conductor decreasing from a first end of the FSL to a second end of the FSL along a length of the FSL; and
    two second conductors disposed on the second surface of the first magnetic material, a width of a gap between the two second conductors decreasing from the first end of the FSL to the second end of the FSL along a length of the FSL.

2. The frequency selective limiter of claim 1, wherein the width of the gap between the two second conductors becomes zero at or before the second end of the FSL.

3. The frequency selective limiter of claim 1, wherein the first conductor corresponds to a signal conductor for the FSL.

4. The frequency selective limiter of claim 1, wherein the two second conductors correspond to ground plane conductors for the FSL, and the first conductor is located relatively at the center of the two second conductors.

5. The frequency selective limiter of claim 1, wherein the width of the first conductor decreases exponentially along a length of the FSL.

6. The frequency selective limiter of claim 1, wherein the width of the first conductor decreases linearly along a length of the FSL.

7. The frequency selective limiter of claim 1, wherein the first conductor and the two second conductors comprise the same material.

8. The frequency selective limiter of claim 1, wherein the first conductor and the two second conductors comprise different materials.

9. The frequency selective limiter of claim 1, wherein the width of the of the gap between the two second conductors stays constant along the length of the FSL.

10. The frequency selective limiter of claim 1 further comprising multiple segments having one or more different characteristics for changes in the width of the first conductor or the width of a gap between the two second conductors.

11. The frequency selective limiter of claim 10, wherein the characteristics for changes in the widths for each segment are decided according to an attenuation factor of one or more preceding segments or a power threshold of the one or more preceding segments.

12. The frequency selective limiter of claim 10, wherein each of the segments forms 50Ω transmission lines and the FSL has a constant characteristic impedance along the length of the FSL.

13. The frequency selective limiter of claim 10, wherein in the power threshold of each segment decreases along a length of the FSL.

14. The frequency selective limiter of claim 10, wherein each segment provides the same level of attenuation to a signal incident on the FSL.

15. The frequency selective limiter of claim 1 further comprising:
    a second magnetic material disposed onto the signal conductor such that the signal conductor is disposed between the first magnetic material and the second magnetic material.

16. The frequency selective limiter of claim 15, wherein the first magnetic material and the second magnetic material comprise the same material.

17. The frequency selective limiter of claim 15, wherein the first magnetic material and the second magnetic material comprise different materials.

18. The frequency selective limiter of claim 15 further comprising:

two second ground conductors on a surface of the second magnetic material, a width of a gap between the two second ground conductors decreasing from the first end of the FSL to the second end of the FSL along a length of the FSL.

19. The frequency selective limiter of claim 18, wherein the first ground conductors and the second ground conductors comprise the same material.

20. The frequency selective limiter of claim 18, wherein the first ground conductors and the second ground conductors comprise different materials.

21. A cascaded frequency selective limiter system comprising:
  a first frequency selective limiter (FSL) comprising:
    a first magnetic material having first and second opposing surfaces;
    a first signal conductor disposed on the first surface of the first magnetic material, a width of the first signal conductor decreasing from a first end of the first FSL to a second end of the first FSL along a length of the first FSL; and
    two first ground conductors disposed on the second surface of the first magnetic material, a width of a gap between the two first ground conductors decreasing from the first end of the first FSL to the second end of the first FSL along a length of the first FSL;
  a second frequency selective limiter (FSL) comprising:
    a second magnetic material having first and second opposing surfaces;
    a second signal conductor disposed on the first surface of the second magnetic material, a width of the second signal conductor decreasing from a first end of the second FSL to a second end of the second FSL along a length of the second FSL; and
    two second ground conductors disposed on the second surface of the second magnetic material, a width of a gap between the two second ground conductors decreasing from the first end of the second FSL to the second end of the second FSL along a length of the second FSL,
wherein an output of the first FSL is coupled to an input of the second FSL.

22. The cascaded frequency selective limiter system of claim 21, wherein the first and second magnetic materials comprise the same material.

23. The cascaded frequency selective limiter system of claim 21, wherein the first and second magnetic materials comprise a different material.

24. The cascaded frequency selective limiter system of claim 21, wherein any of the first or second FSL is a coplanar FSL.

25. A method for forming a frequency selective limiter, the method comprising:
  providing a magnetic material having first and second opposing surfaces;
  disposing a first conductor on the first surface of the magnetic material, a width of the first conductor decreasing from a first end of the FSL to a second end of the FSL along a length of the FSL; and
  disposing two second conductors on the second surface of the magnetic material, a width of a gap between the two second conductors decreasing from the first end of the FSL to the second end of the FSL along a length of the FSL.

26. The method of claim 25, wherein the width of the gap between the two second conductors becomes zero at or before the second end of the FSL.

27. The method of claim 25, wherein the first conductor corresponds to a signal conductor for the FSL, and the two second conductors correspond to ground plane conductors for the FSL and a centerline of the first conductor is disposed along a midpoint between proximate edges of the two second conductors.

28. The method of claim 25, wherein the width of the first conductor decreases exponentially along a length of the FSL.

29. The method of claim 25, wherein the width of the first conductor decreases linearly along a length of the FSL.

* * * * *